(12) United States Patent
Kumar

(10) Patent No.: US 9,006,083 B1
(45) Date of Patent: Apr. 14, 2015

(54) EPITAXIALLY GROWING GAN LAYERS ON SILICON (100) WAFERS

(76) Inventor: Ananda H. Kumar, Fremont, CA (US)

( * ) Notice: Subject to any disclaimer, the term of this patent is extended or adjusted under 35 U.S.C. 154(b) by 160 days.

(21) Appl. No.: 13/398,826

(22) Filed: Feb. 16, 2012

Related U.S. Application Data

(63) Continuation-in-part of application No. 13/337,045, filed on Dec. 23, 2011.

(60) Provisional application No. 61/443,257, filed on Feb. 16, 2011, provisional application No. 61/427,142, filed on Dec. 24, 2010.

(51) Int. Cl.
  H01L 33/00 (2010.01)
  H01L 21/02 (2006.01)

(52) U.S. Cl.
  CPC . H01L 21/02389 (2013.01); *H01L 2224/45105* (2013.01)

(58) Field of Classification Search
  USPC .......... 257/190, 200; 438/457, 478–481, 438/492–509
  See application file for complete search history.

(56) References Cited

U.S. PATENT DOCUMENTS

| | | | |
|---|---|---|---|
| 6,045,626 A * | 4/2000 | Yano et al. | 148/33.4 |
| 2002/0069816 A1 * | 6/2002 | Gehrke et al. | 117/84 |
| 2011/0057165 A1 * | 3/2011 | Pinnington | 257/13 |

* cited by examiner

*Primary Examiner* — Matthew W Such
*Assistant Examiner* — David Spalla

(57) ABSTRACT

Methods and structures for GaN on silicon-containing substrates are disclosed, comprising a texturing process to generate a rough surface containing (111) surface, which then can act as an underlayer for epitaxial GaN. LED devices are then fabricated on the GaN layer. Variations of the present invention include different orientations of silicon layer instead of (100), such as (110) or others; and other semiconductor materials instead of GaN, such as other semiconductor materials suitable for LED devices.

8 Claims, 7 Drawing Sheets

Providing a single crystal silicon substrate,
wherein the silicon substrate comprises a first side and
a second side
400

Attaching a layer to the first side of the silicon substrate
to form a composite substrate,
wherein the layer has coefficient of thermal expansion
(CTE) higher than that of GaN,
wherein the effective CTE of the composite substrate is
higher than that of GaN so that a subsequently
deposited GaN layer on the second side of the silicon
substrate does not crack at room temperature
410

Fig. 4

Providing a single crystal silicon substrate, wherein the silicon substrate comprises a first side, wherein the first side comprises (100) crystal orientation
700

Texturing etch the substrate to form pyramidal surface textures on at least the first side, wherein the pyramidal surface textures comprise (111) crystal orientation
710

Depositing a layer of GaN on the pyramidal surface textures
720

Fig. 7

EPITAXIALLY GROWING GAN LAYERS ON SILICON (100) WAFERS

This application claims priority from U.S. provisional patent application Ser. No. 61/443,257, filed on Feb. 16, 2011, entitled "Epitaxially Growing GaN Layers on Silicon (100) Wafers", and is a continuation-in-part of application Ser. No. 13/337,045, filed on Dec. 23, 2011, which claims priority from U.S. provisional patent application Ser. No. 61/427,142, filed on Dec. 24, 2010, entitled "Methods and structures for preparing single crystal silicon wafers for use as substrates for epitaxial growth of crack-free gallium nitride films and devices", which are incorporated herein by reference.

BACKGROUND

Single crystal gallium nitride is a technologically important material finding increasing use in high frequency RF devices, and Light Emitting Diodes (LEDs). In the absence of methods to form single crystals of this and similar materials from melt, they are invariably grown by hetero-epitaxy by metal-organic chemical vapor deposition, M-O-CVD, or by atomic layer deposition, ALD, on single crystal substrates of sapphire (Al2O3), or silicon carbide (SiC), because of their refractory nature, purity, inertness, and reasonably close lattice structure match to gallium nitride. Both sapphire and silicon carbide are in themselves extremely hard to grow as single crystals, the larger the diameter, the harder to make them. Until recently, nearly 90% of gallium nitride crystals were grown on 2-inch diameter. Only in 2009 this percentage dropped below 50%, and now most new LED fabricators are using 4" substrates, and some even venturing into 6" diameter sapphire wafers. Growing GaN on single crystal silicon carbide is somewhat easier because of closer lattice matching, but silicon carbide wafers are stuck at 2" diameter. GaN growth, on the small diameter sapphire wafers entails an enormous loss of productivity. This is a great impediment to them affordable for replacing the incandescent lighting. It is for this reason that there has been a continuing effort to use silicon wafers as substrates for GaN Epitaxy.

If silicon wafers can be used easily for growing gallium nitride, the advantages of larger wafer sizes, wide availability, atomically smooth growth surfaces, would quickly lead to their wide adoption. Why is this not the case? Growing GaN epitaxially on silicon (111) would face both a larger lattice mismatch (17%), and a larger thermal expansion mismatch (about 50%). Researchers have been able to bridge the lattice mismatch the same way as is done in cases of sapphire and silicon carbide, here using buffer layers of AlGaN to grow low defect GaN films on silicon. This greatly reduces the lattice strain in GaN layer and, as a result, reduces the dislocation density to reasonable levels. However, the sign and magnitude of thermal contraction mismatch between GaN and silicon, are such to give rise to extensive cracking of the latter upon cooling. In practical terms, this limits the thickness and size of useful devices, and the yield of such devices.

Some ingenious methods for growing GaN on silicon have been developed to enable the use of silicon substrates for GaN growth. Almost all these methods are based on modifying the growth surface with a) use of multiple or varied buffer layers, b) limiting the size of crystals growing and of crack prorogation by scoring the silicon wafer surface, c) limiting growth surface with in-situ silicon nitride masking, and allowing for lateral growth over the masked areas to fill the surface, and d) to change the growth morphology to nano rods. Even with these difficulties, after years of development, limited commercial production of GaN on silicon substrates has just begun.

The one case where a silicon wafer was modified on the non-growth side missed the mark. They attached very thin silicon 111 wafer, or very thin single crystal silicon carbide wafer, to polycrystalline silicon carbide wafers, apparently to reduce cost of the growth wafers. They missed the mark in the sense, that the support wafer bonded to the growth wafer, either had the same or similar coefficient of thermal expansion to silicon, in one case, and silicon carbide, in another, to make any difference in the cracking behavior. Even then, the researchers reported growing good quality GaN epitaxial layers on 2" substrates.

BRIEF DESCRIPTION OF THE DRAWINGS

FIG. 4 illustrates an exemplary flowchart for forming a composite substrate according to some embodiments of the present invention.

FIG. 7 illustrates an exemplary flow chart according to some embodiments of the present invention.

DETAILED DESCRIPTION OF THE PREFERRED EMBODIMENTS

Figure 1A:
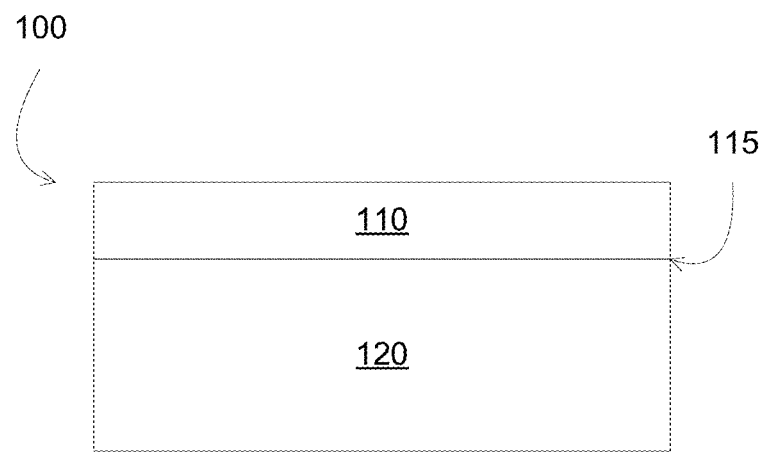
FIGS. 1A-1B illustrate exemplary composite substrates according to some embodiments of the present invention.

In some embodiments, this invention relates to preparing single crystal silicon wafer for epitaxially growing gallium nitride, which can prevent the cracking that generally occurs in the deposited gallium nitride film, upon cooling from the elevated growth temperatures. More particularly the invention teaches a new approach that involves modifying the silicon (111) wafer substrate, on the side opposite to the gallium nitride growth side, by coating of a suitable material having a thermal expansion higher than that of GaN. This layer, hereinafter referred to as a 'stabilizing layer', induces compressive stresses in both the silicon and the GaN layers, upon cooling from room temperature. Since the induced compressive stress permeates into the GaN layer, though the silicon wafer, it in effect neutralizes the tensile stress induced in the GaN by silicon and, thereby, stabilizes it.

In some embodiments, the silicon substrate is first prepared by integrally attaching, or forming the stabilizing layer, in a separate step prior to using it for epitaxial deposition of gallium nitride. At the GaN growth step, the epitaxially deposited GaAlN or similar buffer layers, commonly known in the art, are first deposited on the (111) Si surface to bridge the lattice mismatch to GaN, followed by the deposition of GaN layer. Upon cooling to ambient temperature, the GaN layer will remain intact without cracking. The composite wafer can be processed for device making and forming interconnections, after which it can be diced, and separated from silicon layer by etching off the latter.

In some embodiments, the stabilizing layer can be a refractory material, such as a thin film of metal or ceramic, thick film metal or ceramic, or bulk substrates of metal, ceramic or glass integrally bonded to the silicon wafer surface. It is preferred that the material of the stabilizing layer have a coefficient of thermal expansion, CTE, higher than that of GaN. The silicon wafer can be in pre-stressed condition after the application of the stabilizing layer, which generally requires a higher temperature deposition for the layer. The thickness of the stabilizing layer can be such as to induce compressive stress in the silicon upon cooling from the layer application temperature. In fact, the compressive stress can be sufficiently high also to induce compressive stress in the gallium nitride after its deposition on the silicon wafer, and cooling to ambient temperature. The stress level is a function of the nature of the coating material; the process used for its application, in particular the application temperature, its CTE, and thickness. Thinner silicon wafers are preferred, because thinner stabilizing layers can be used to obtain the desired effect on the deposited gallium nitride. These parameters can be modeled from known thermal, mechanical and physical properties of silicon, the stabilizing layer, and gallium nitride film. It is much more easily determined, at the outset, from well designed experimentation.

Figure 1B:
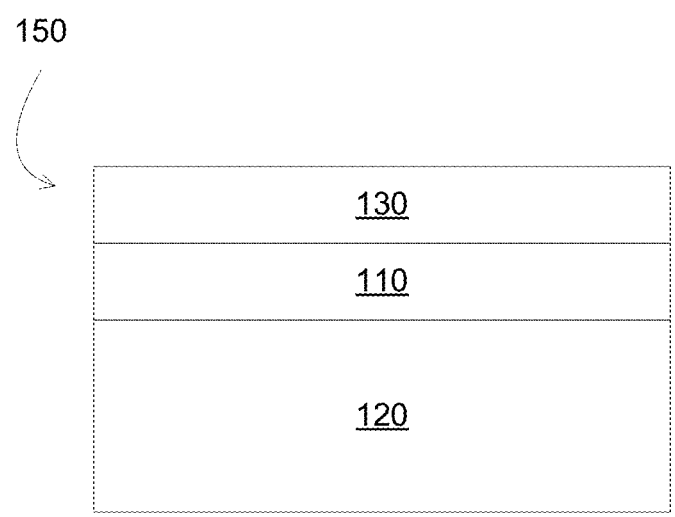

FIGS. 1A-1B illustrate exemplary composite substrates according to some embodiments of the present invention. In FIG. 1A, a composite substrate 100 is shown, comprising a silicon layer 110 disposed on a support layer 120. In some embodiments, the silicon layer 110 comprises a single crystal silicon layer. The silicon layer can be less than 500 micron thick, preferably less than 100 microns, and more preferably is between 10 and 50 microns. In some embodiments, the silicon layer is preferably have a (111) crystallographic surface. In some embodiment, an adhesive layer 115 is disposed between the silicon layer 110 and the support layer 120, for example, to strengthen the bond between the two layers. In some embodiments, the support layer has coefficient of thermal expansion (CTE) higher than that of GaN. Also, the effective CTE of the composite substrate 100 is higher than that of GaN so that a subsequently deposited GaN layer on the silicon substrate 110 does not crack at room temperature.

In some embodiments, the thickness of the support layer is higher than that of the silicon layer. For example, the thickness of the support layer can be thicker than 100 microns, preferably thicker than 500 microns, and can be thicker than 1 mm.

In some embodiments, the support layer and the silicon layer are strongly bonded together, and thus acting as a composite substrate with respect to thermal expansion. The effective thermal expansion of the composite substrate is a result of a balance between the high thermal expansion of the support layer and the low thermal expansion of the silicon. The effective coefficient of thermal expansion can be calculated from the thermal expansion of the composite substrate. In general, the coefficient of thermal expansion is related to the individual coefficients of thermal expansion and thicknesses of the support layer and the silicon substrate. For example, a much thicker support layer will provide an effective coefficient of thermal expansion similar to that of the support layer, since the effect of the silicon layer is smaller.

In FIG. 1B, a composite substrate 150 is shown, comprising a GaN layer 130 disposed on a silicon layer 110 disposed on a support layer 120. The substrate 150 can be formed by depositing a GaN layer on a substrate 110. In some embodiments, the thickness of the GaN is higher than 2 microns, and can be higher than 5 microns. The effective CTE of the composite substrate 150 is higher than that of GaN so that the GaN layer does not crack after cooled to room temperature. In some embodiments, the GaN layer comprises a buffer layer under a GaN layer for lattice matching with the silicon layer 110.

While the present description utilizes single crystal silicon substrates, other substrates can be used, such as silicon-containing substrates (e.g., SiGe substrates, composite substrates having a silicon layer on a support substrate, etc.).

Without limiting the scope of this invention the types of stabilizing layer can be categorized into several categories, viz. (i) vacuum deposited thin films of metal or ceramic, (ii) thick films (of metal, ceramic, or glass), (iii) bulk substrates (of metal, glass, or ceramic) with an attachment layer of glass or metal., (iv) in-situ formed glass-ceramic coatings.

(i) Depositing Stabilizing Layers:

In some embodiments, highly stressed films can be deposited, for example, at the backside of the silicon substrate. If the stress of the composite substrates (e.g., silicon substrates having the deposited films) is sufficiently high, it can compensate for the stress induced by the GaN when cooling, and the stress of the GaN would be compressive. In terms of thermal expansion, if the thermal expansion of the composite substrates is higher than that of the GaN, this would prevent cracking in the GaN upon cooling, with the stress of the GaN compressive.

In some embodiments, sputtered or evaporated thin films of refractory metals such as molybdenum and tungsten, if deposited at elevated temperatures, can induce large compressive stress in silicon. This process would be a natural choice in the semiconductor processing culture, if the selected metals are not detrimental to the subsequent processes, e.g., do not introduce contamination to the GaN layer (or to the devices that form on the silicon substrate), for example, reacting with the process gases, the silicon substrate, and gallium nitride. The economics of this approach depends on the thickness of films required to achieve the desired level of beneficial compressive stress in the gallium nitride layer later grown on the silicon wafer. The advantages of this method are clean processing, ease of thickness control, good thermal conductivity of metal films, and compatibility with downstream device processing.

In addition to metals, other material, such as ceramic films deposited by a sputtered process, can also be used to induce the desired stress in the silicon substrate. The thickness of such sputtered ceramic films would need to be optimized, since thin films with inadequate thickness might not be able to withstand the balancing tensile stress and the subsequently deposited gallium nitride would crack upon cooling.

(ii) Coating Stabilizing Layers:

In some embodiments, alternating to deposition processes, such as vacuum thin film deposition processes, other coating processes can be used to form a composite substrate that can sustain the device fabrication processes, for example, the high temperature deposition of GaN.

In some embodiments, thick films are formed by applying to substrate powders of ceramics, glass, or metals, in the form of a spray-able slurry, or printable paste (such as metal inks) with suitable organic binders and solvents, followed by heating to expel the organics, and sinter the powder to produce bulk coatings on the substrate. To improve the adhesion of the consolidated ceramic or metal powders to the underlying substrates, an adhesive can be used, such as mixing a glass powder with the ceramic or metal powder. The glass powder would melt and help consolidate the ceramic powder and also bond to the oxidized silicon surface. The adhesive would need to be optimized to prevent interfering with the subsequent device processing. For example, certain glass powder exhibits temperature softening in the glass phase, and thus limiting the refractoriness in the formation of the stabilizing layer, which can be a serious limitation for using thick film stabilizing layers for typical gallium nitride growth temperatures.

Other criterions would also need to be considered in the material and process selections for forming the thick film coating, such as metal contamination, softening, and compatibility with downstream device processing.

(iii) Bulk Substrates for Stabilizing Layer:

In some embodiments, bulk metal, such as stainless steel, molybdenum, tungsten, and bulk ceramic substrates of polycrystalline aluminum oxide, aluminum nitride, zirconia, can be used as the support layer. Adhesion additives can be used, since metal substrates and ceramic substrates might be separated at high temperature. Exemplary adhesion materials include a glass or metal bonding layer at the interface. The same is true for glass substrates such as those made of Pyrex or similar refractory glass. Limitations in size and cost for these substrates are a further factor to be considered.

(iv) In-Situ Formed Glass-Ceramic Coating or Substrates for Stabilizing Layer:

In some embodiments, powders of certain glass compositions, when heated to temperatures in the range of the softening point of the corresponding bulk glass, crystallize and densify to yield essentially a ceramic body more refractory than the parent glass. If these glass powders are suitably disposed on a suitable substrate, such as a silicon wafer, they would also adhere well to the substrate during such consolidation. This provides a convenient method for forming self-adhering, refractory stabilizing layer of this invention on the silicon wafer, provided the CTE of the resulting glass-ceramic is higher than the CTE of gallium nitride. A convenient method to dispose the glass powder is to first form a green tape of the glass powder by mixing it with suitable polymeric binders and plasticizers and solvents. The green tape technology is already well developed for fabricating so called Low Temperature Co-fired Ceramic, or simply LTCC substrates. Details of the LTCC substrates have been disclosed in co-pending patent application Ser. Nos. 12/558,486 and 12/558,490, hereby incorporated by reference.

A wide choice of glass compositions are known in the literature with the desired sintering and crystallizing characteristics. These glass compositions have been developed for fabricating low temperature co-fired ceramic, or simply LTCC, substrates. In our preferred approach, glasses in the $MgO—Al_2O_3—SiO_2$ system, having MgO in the range of 15-28% by weight, $Al_2O_3$ in the range of 9-15% by weight, the remainder made of silica, except for less than 2% of other ingredients such as $TiO_2$, $ZrO_2$, $P_2O_5$, or $B_2O_3$. The glass powders of these compositions fully densify in the temperature range of 850° C. to 950° C., and yielding dense, strong glass-ceramics having thermal expansion coefficients in the range of 4-6.5 ppm/° C., higher that of both silicon and gallium nitride, as desired.

In some embodiments, to form the stabilizing layer of this invention, the green ceramic tape of the suitably chosen glass powder is applied to the single crystal silicon wafer, typically of (111) orientation, on the side opposite to the polished side reserved for later gallium nitride deposition. The green tape is placed on the silicon surface and heated to temperatures of 50-100° C., and at pressures of 500-1000 psi designed to soften and stick it securely to the wafer surface. The wafer-green tape assembly is then cured at the required high temperature. During this consolidation the glass sinters to a strong and dense, glass-ceramic body, strongly bonded to the oxidized silicon surface. On cooling from the consolidation temperature, the differences in the thermal coefficients expansion, CTEs, of silicon and the resulting glass-ceramic will induce significant compressive stress in the silicon and corresponding tensile stress in the glass-ceramic stabilizing layer. The glass-ceramic layer should be sufficiently strong to resist cracking, and sufficiently thick to avoid excessive wafer bow.

This pre-stressed silicon is then cleaned and prepared for gallium nitride epitaxial deposition. At the deposition temperature, the wafer composite will be essentially stress-free and flat. As the wafer is cooled to ambient temperature, compressive stresses develop in both silicon and the gallium nitride layers, preventing cracking that would have otherwise occurred in the absence of the glass-ceramic stabilizing layer. The composite wafer is processed as needed to form discrete gallium nitride layers. The wafer is then diced, and devices are released by etching off the silicon.

Ceramic coatings for silicon wafers of this invention are fabricated from ceramic precursors suitably disposed on one of the major surfaces of the silicon wafer and heating in air to temperatures in the range of 800-1200 C, and more preferably to between 900-1100 C, expel the organic binders and consolidate the ceramic powder into bulk ceramic coatings, whose CTE will be in the range of 6-10×10 ppm/C. of GaN measured from its growth temperature of around 1000 C. Examples of suitable ceramic precursors include refractory ceramic powders, such as aluminum oxide, zirconium oxide, mullite, mixed with suitable glass powders that fuse during the first heating step to bind the ceramic powders to form a bulk ceramic coating having CTE equal to or greater that of gallium nitride In some embodiments, the glass powders can comprise glass compositions in systems in $MgO—Al_2O_3—SiO_2$, $CaO—Al_2O_3—SiO_2$, $BaO—Al_2O_3—SiO_2$, or mixtures thereof, which when heated to temperatures in the preferred temperature range of 900-1100 C, fuse and crystallize to form a bulk coating having CTE>CTE of GaN.

A composite structure consisting of a continuous (crack-free) single crystal gallium nitride layer greater than 2 micron thickness, single crystal silicon and polycrystalline ceramic coating having CTE higher than that of gallium nitride as measured from its (GaN's) growth temperature, in that order.

In some embodiments, gallium nitride layer may comprise gallium nitride layer may consist of suitable buffer layers aimed at bridging the mismatch in lattice between that of silicon and gallium nitride. Gallium nitride layer may consist of suitable gallium nitride alloy layers for electronic device fabrication. In some embodiments, electronic devices can be fabricated on the GaN layer, such as light emitting diode structures.

Figure 2A:
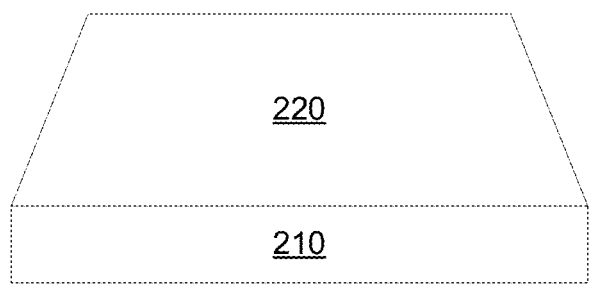
FIGS. 2A-2B illustrate an exemplary process flow for forming a composite substrate according to some embodiments of the present invention.
Figure 2B:
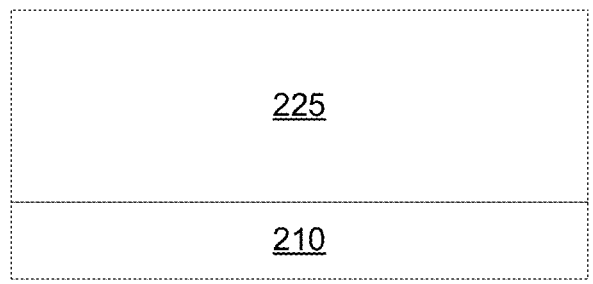

FIGS. 2A-2B illustrate an exemplary process flow for forming a composite substrate according to some embodiments of the present invention. In FIG. 2A, a slurry of glass powder 220 is disposed on a silicon substrate 210. The slurry can be sprayed, or pasted on the silicon substrate. The slurry can comprise glass powder, polymeric binders, plasticizers, and solvents.

In FIG. 2B, the silicon substrate with the slurry layer is heated solidify the slurry, forming a composite substrate comprising a silicon layer 210 disposed on a ceramic layer 225.

Figure 3A:
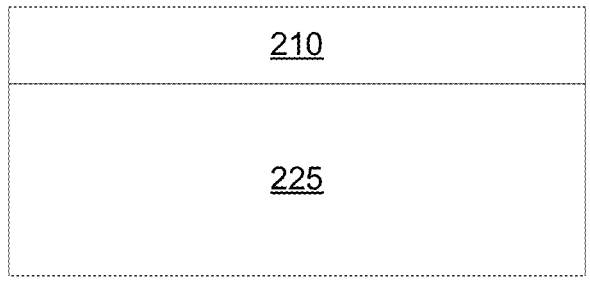
FIGS. 3A-3B illustrate an exemplary process flow for forming a composite GaN substrate according to some embodiments of the present invention.
Figure 3B:
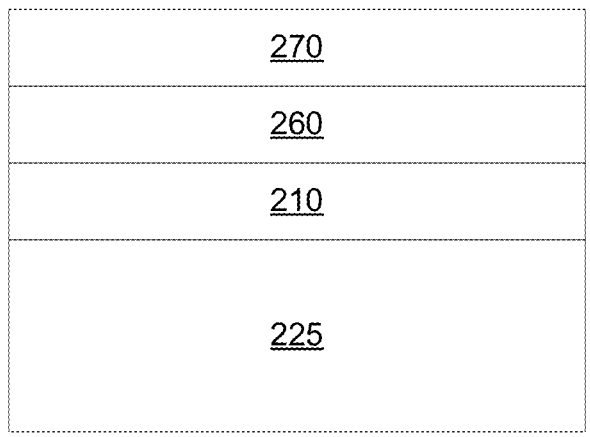

FIGS. 3A-3B illustrate an exemplary process flow for forming a composite GaN substrate according to some embodiments of the present invention. In FIG. 3A, a composite substrate comprising a silicon layer 210 disposed on a ceramic layer 225 is provided. The composite substrate can be prepared by attaching a ceramic layer on a silicon layer, such as in a process described above. In FIG. 3B, an optional buffer layer 260 is deposited on the composite substrate, followed by a GaN layer 270. The buffer layer 260 can serve as a lattice matching layer, to match the lattice of GaN with that of the silicon.

In some embodiments, the present invention discloses methods for forming a continuous (or crack-free) gallium nitride layer on silicon substrates. An exemplary method of forming a single crystal gallium nitride layer of thickness exceeding 2 microns on a single crystal silicon substrate can comprise the steps of a. Forming a polycrystalline ceramic layer having CTE greater than that of gallium nitride on one of the planar sides of a single crystal silicon substrate in a first heating step b. Cooling the ceramic-coated silicon substrate to ambient temperature c. Growing single crystal gallium nitride layer of thickness exceeding 2 microns in thickness on the silicon surface opposite to the ceramic coating on the silicon substrate in a second heating step d. Cooling the composite of single crystal gallium nitride layer e. Fabricating GaN nitride on the composite gallium nitride layer (optional)

In some embodiments, a ceramic precursor is disposed on the silicon substrate before the first heating step. After the first heating, the ceramic precursor solidifies and bonds with the silicon substrate to form a composite substrate. In some embodiments, forming step of polycrystalline ceramic layer having CTE equal to or greater that of gallium nitride including forming from ceramic powder precursors in the first heating step. The first heating step can be carried out to temperatures in the range of 800-1200, and most preferably to temperatures in the range of 900-1100 C.

In some embodiments, the ceramic precursors include refractory ceramic powders, such as aluminum oxide, zirconium oxide, mullite, mixed with suitable glass powders that fuse during the first heating step to bind the ceramic powders to form a bulk ceramic coating having CTE equal to or greater that of gallium nitride. The ceramic precursors can include certain glass powders, such as from glass compositions in systems in $MgO—Al_2O_3—SiO_2$, $CaO—Al_2O_3—SiO_2$, $BaO—Al_2O_3—SiO_2$, or mixtures thereof, which when heated to temperatures in the preferred temperature range fuse and crystallize to form a bulk coating having CTE>CTE of GaN. The single crystal silicon can be of (111) orientation. In some embodiments, the single crystal silicon surface is from (100) orientation, and which is then completely covered with pyramids of having (111) facets produced by anisotropic etching.

In some embodiments, growing gallium nitride step includes epitaxially depositing single crystal gallium nitride from pyrolitic decomposition of certain gallium metal organic gaseous precursors in MOCVD reactor at high temperatures. In some embodiments, growing gallium nitride step includes first depositing buffer layers aimed at bridging the lattices of silicon and of gallium nitride to be grown thereon. The buffer layers can include aluminum nitride, aluminum gallium nitride, zirconium fluoride, and others known in the art. Gallium nitride layer can include gallium nitride alloy layers required to form suitable device structures. For example, the alloy layers can include magnesium doped gallium nitride layers, or silicon doped gallium nitride layers. In some embodiments, gallium nitride devices including light emitting diodes (LED).

FIG. 4 illustrates an exemplary flowchart for forming a composite substrate according to some embodiments of the present invention. Operation 400 provides a single crystal silicon substrate, wherein the silicon substrate comprises a first side and a second side. Operation 410 attaches a layer to the first side of the silicon substrate to form a composite substrate, wherein the layer has coefficient of thermal expansion (CTE) higher than that of GaN, wherein the effective CTE of the composite substrate is higher than that of GaN so that a subsequently deposited GaN layer on the second side of the silicon substrate does not crack at room temperature. In some embodiments, the method further comprises applying an adhesive to the first side of the silicon substrate before attaching the layer.

In some embodiments, the second side of the silicon substrate comprises a (111) crystallographic surface. The thickness of the silicon substrate can be less than 50 microns. The attaching the layer can comprise depositing the layer in vacuum. The layer can comprise a refractory metal or ceramic. The attaching the layer can comprise bonding a bulk metal layer or a bulk ceramic layer to the silicon substrate through an adhesion layer. The attaching the layer can comprise spraying a slurry on the silicon substrate and sintering to bond the slurry with the silicon substrate, wherein the slurry comprises a mixture of a powder of ceramic, glass, metal, or a combination thereof. The slurry can comprise an adhesive additive. The attaching the layer can comprise pasting a paste on the silicon substrate sintering to bond the paste with the silicon substrate, wherein the slurry comprises a mixture of a powder of ceramic, glass, metal, or a combination thereof. The paste can comprise an adhesive additive. The attaching the layer can comprise disposing a glass powder to the silicon substrate and sintering the glass powder to form the composite substrate.

Figure 5:
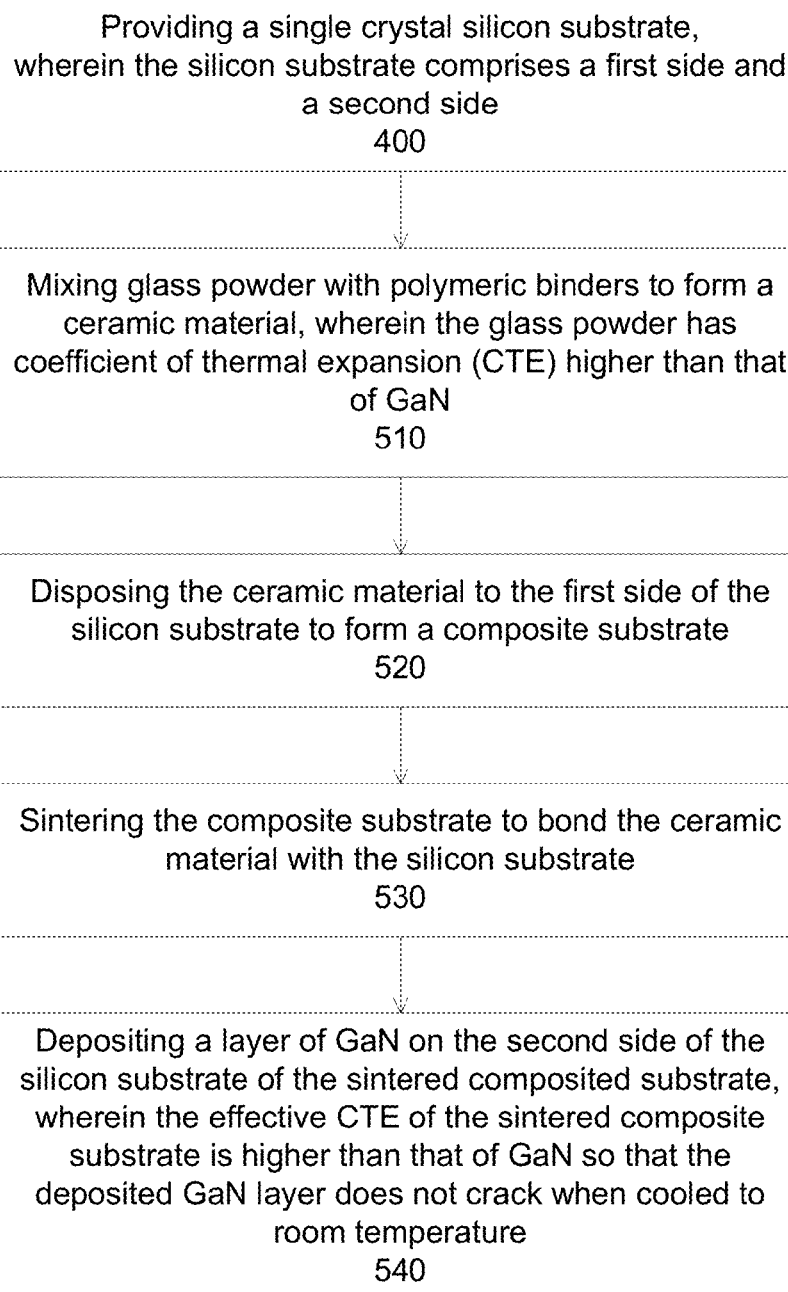
FIG. 5 illustrates another exemplary flowchart for forming a composite substrate according to some embodiments of the present invention.

FIG. 5 illustrates another exemplary flowchart for forming a composite substrate according to some embodiments of the present invention. Operation 500 provides a single crystal silicon substrate, wherein the silicon substrate comprises a first side and a second side. Operation 510 mixes glass powder with polymeric binders to form a ceramic material, wherein the glass powder has coefficient of thermal expansion (CTE) higher than that of GaN. Operation 520 disposes the ceramic material to the first side of the silicon substrate to form a composite substrate. Operation 530 sinters the composite substrate to bond the ceramic material with the silicon substrate. Operation 540 deposits a layer of GaN on the second side of the silicon substrate of the sintered composited substrate, wherein the effective CTE of the sintered composite substrate is higher than that of GaN so that the deposited GaN layer does not crack when cooled to room temperature. In some embodiments, a buffer layer is deposited before depositing the GaN layer. In some embodiments, the ceramic material comprises a magnesium oxide-aluminum oxide-silicon oxide composition. The sintering comprises annealing at temperature 850 to 950 C.

In some embodiments, the present invention discloses methods and structures for GaN on silicon-containing substrates. Starting with a substrate having a layer of (100) silicon, a texturing process is performed to generate a rough surface containing (111) surface. Epitaxial GaN is then deposited on the (100) silicon layer having (111) texture surface, optionally through one or more buffer layers for lattice matching. LED devices are then fabricated on the GaN layer. Variations of the present invention include different orientations of silicon layer instead of (100), such as (110) or others; and other semiconductor materials instead of GaN, such as other semiconductor materials suitable for LED devices.

In some embodiments, the present invention discloses a substrate for LED devices, comprising a (100) silicon layer with (111) texture surface. The substrate can also comprise buffer layers to enable lattice matching. The substrate can also comprise GaN or other semiconductor materials suitable for LED devices. In an embodiment, the substrates comprise other orientations of silicon. The size of the texture can be tailored for meet the requirements of LED device fabrication processes, such as from a few microns to a few hundred microns.

The texturing substrates can reduce or eliminate the effects of the thermal coefficient mismatch between silicon and GaN, enabling a thicker GaN for LED fabrication. In addition, the texturing substrate can provide automatic texturing of the GaN, potential increasing the performance of the LEDs.

In some embodiments, a layer of compensating CTE is further disposed on the back of the silicon substrate, further enabling the reduction and elimination of CTE effects.

Today, sapphire (0001) is the most widely used substrate for epitaxial deposition of gallium nitride principally because its coefficient of thermal expansion, CTE, is higher than that of gallium nitride, a condition needed to prevent its cracking after cooling from growth temperature of about 1100 C. This despite the fact that sapphire substrates come in small sizes, mostly 2" to 4" in diameter, and their costs are high. Freed from the stress concern, the lattice mismatch is bridged by the deposition of certain buffer layers, such as AlGaN and others.

The gallium nitride industry would like to migrate to silicon wafers, which are available in much larger diameters, and at much lower prices. But, unlike sapphire, the CTE of silicon is lower than that of GaN, which causes significant tensile stresses and extensive cracking in the GaN layer upon cooling.

And yet, interest in using silicon wafers for GaN epitaxial growth, has only increased in recent years. Silicon (111) is the most favored growth surface for GaN growth on silicon because it offers the closest lattice matching to GaN. Methods used for bridging the lattice mismatch are similar to those used for GaN on sapphire, involving deposition of certain epitaxial buffer layers such as AlGaN.

Approaches to overcoming the CTE-stress caused cracking that have been disclosed can be broadly classified into a. methods that limit lateral the sizes of the GaN by scribing, or selective, in-situ SiN masking of the silicon surface, and b. to epitaxially depositing stress-absorbing layers such as AlN, and AlN/GaN super-lattice structures on the silicon (111) surface, prior to depositing the lattice-bridging buffer layers, and GaN.

The very thin, 2 µm or less, GaN layers that are grown on silicon by these methods cannot be effectively textured on their surfaces after growth because of lack of chemical texturing methods, and harshness of physical texturing methods.

These and similar prior art methods for epitaxial growth of GaN on silicon (111) suffer from limitations in terms of film thickness, device size, device quality, and process complexities impacting yields.

Also, silicon (111) wafers are not easily grown, limiting their availability in larger sizes. The cost of these wafers, much less that of sapphire wafers of similar sizes, is still higher than that for silicon (100) wafers.

Therefore:

It is an object of this invention to provide a means for growing GaN layers on less expensive silicon (100) wafers.

It is another object of this invention to grow thicker GaN layers than possible with prior art methods without the danger of cracking.

It is another object this invention to grow GaN layers on silicon (100) wafers without limitations to their lateral dimensions of devices that can be formed. The GaN layer can span the entire surface of the silicon wafer without cracking.

It is another object of this invention to grow GaN on silicon (100) wafers without the use of any of the so-called stress-reducing buffer layers to simplifying the growth process.

It is another object of this invention to grow GaN on silicon (100) wafers with grown-in, microns-size texturing that greatly increases the light output from subsequently-formed device structures.

It is another object of this invention to grow GaN on silicon (100) wafers with a compressive stress.

It is another objective of this invention to grow GaN on silicon (100) wafers on atomically-smooth silicon surfaces to reduce defects in GaN layer.

These and other objects are accomplished as follows:

Start with polished silicon (100) wafers. Single sided polishing is adequate.

The polished side of the silicon (100) wafer is cleaned by using RCA cleaning, and other methods using hydrofluoric acid solutions, and by methods that are well known in the semiconductor art.

The cleaned (100) surface of the wafer is 'texture' etched by known methods, to completely cover its surface with pyramids bounded by (111) planes or facets. This etching is nearly self-limiting, in the sense that once the silicon surface is covered with the (111) pyramids, the etching rate will be substantially reduced. The prior art methods teach nucleation conditions necessary to produce a high density of nuclei so that the sizes of the pyramids are small, 10 microns or less, preferably 5 microns or less, and as uniform in size as is possible. Texture etching is done either with hot potassium hydroxide solution or with very dilute tetramethyl ammonium hydroxide (TMAH) solution. In both cases, alcohol additions, such as of isopropyl-alcohol, IPA, aids in good wetting and bubble-release, helping to produce small and uniform pyramids.

Figure 6:
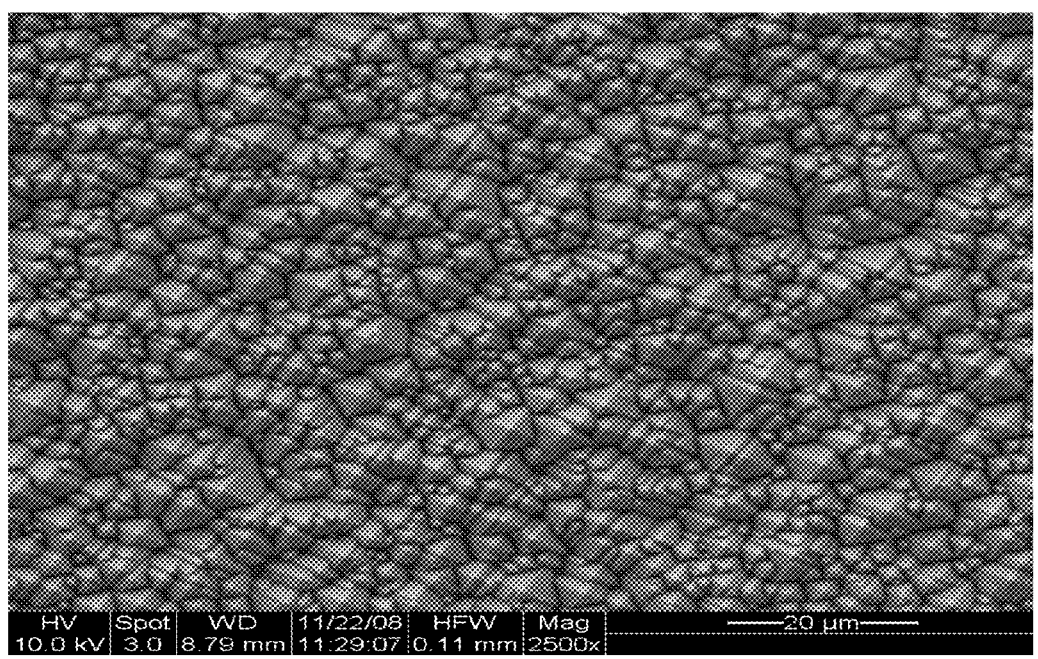
FIG. 6 shows such a texture-etched Si(100) wafer showing Si (111)-bound pyramids about 5 microns or less in size.

FIG. 6 shows such a texture-etched Si(100) wafer showing Si (111)-bound pyramids about 5 microns or less in size. Unlike the polished surfaces of silicon wafers, the Si (111) facets of the pyramids formed by texture etching are truly atomically smooth and ideal for epitaxial deposition of gallium nitride. This will ensure low defect density in the grown films.

Next, GaN is deposited on the texture-etched surface of the silicon (100) wafer in the MBE, CVD, or MOCVD reactor, by methods known in the art. First sufficient thicknesses of suitable 'buffer layers' are deposited for bridging the lattice mismatch between silicon (111) and GaN (0001). This is followed by the deposition of gallium nitride device structures, in the same deposition run. These buffer layers and their deposition conditions are known in art, and may include, AlN, AlGaN, ZrF2, either singly, or in combination.

For epitaxial growth of GaN on silicon (111), it is also common practice to deposit certain 'stress absorbing buffer layers, prior to the lattice—bridging 'buffer layers.' Depositing these two types of epitaxial buffer layers, involves additional materials and process steps, requiring close control of the deposition process. This could compromise both the GaN quality and yields.

In present invention, where the deposition surface is made up of numerous Si (111) pyramids on the silicon (100) wafer, the use of stress absorbing layers is optional. That is because of the fact that the silicon (111) pyramid faces are small, typically 2-10 µm, and the linear dimension of in any one direction in any local region is limited to this dimension, helping to prevent large lateral CTE strain build-up and cracking upon cooling. When gallium nitride is grown on a planar surface of a silicon (111) wafer, cracking has been observed to occur at lateral dimensions of 100 µm or more. Thus silicon (100) wafers, with texture etched (111) pyramid-covered growth surface can be used for obtaining crack-free epitaxially-grown gallium nitride layers of required thicknesses.

Additionally, the silicon (100) wafer can be first prepared by firing-on a self-adhering glass-ceramic layer wafer having higher CTE than that of silicon, on the side opposite to gallium-nitride growth surface. The compressive stress induced by the ceramic in the silicon wafer, will provide additional protection against the cracking of GaN. (see co-pending patent application 61/427,142, filed Dec. 24, 2010, hereby incorporated by reference). In this case the CTE of the self-adhering glass-ceramic layer should be higher than that of silicon. Preferably, the CTE of the glass-ceramic layer, should be in the range of $(3.0\text{-}10.0) \times 10^{-6}/°C.$, preferably, in the range of $(3.2\text{-}4.5) \times 10^{-6}/°C.$, as measured to the GaN growth temperature. The growth surface is texture-etched to form (111) pyramids, prior to deposition of GaN.

The gallium nitride layer grown on the (111) texture etched silicon (100) wafer, will be characterized by having the same or similar pyramidal surface textures on its two surfaces. Such highly textured surfaces in GaN are sought after for increasing the light output of LED devices. This is an important advantage of the process of this invention.

The gallium nitride epitaxial layer formed on the silicon (100) wafer, can be used as such on the silicon wafer, transferred to a handle substrate and simultaneously released from the silicon wafer, or it can be separated from the latter to obtain a free-standing film. By enabling the growth of thicker gallium nitride layers, this invention makes it practical to have such freestanding gallium nitride layers and devices.

FIG. 7 illustrates an exemplary flow chart according to some embodiments of the present invention. In operation 700, a single crystal silicon substrate is provided, wherein the silicon substrate comprises a first side, wherein the first side comprises (100) crystal orientation. In operation 710, the substrate is textured etched the substrate to form pyramidal surface textures on at least the first side, wherein the pyramidal surface textures comprise (111) crystal orientation. In operation 720, a layer of GaN is deposited on the pyramidal surface textures. In some embodiments, a buffer layer can be deposited before depositing the GaN layer for lattice matching. In some embodiments, LED device structures are fabricated on the GaN layer. In some embodiments, a layer of compensating CTE, such as a ceramic layer is deposited on the back of the silicon substrate.

What is claimed is:

1. A method comprising
   providing a single crystal silicon substrate,
      wherein the silicon substrate comprises a first side having (100) crystal orientation;
   mixing glass powder with polymeric binders to form a ceramic material, wherein the glass powder has coefficient of thermal expansion (CTE) higher than that of GaN;
   disposing the ceramic material to a second side of the silicon substrate to form a composite substrate, wherein the second side is opposite to the first side;
   sintering the composite substrate to bond the ceramic material with the silicon substrate;
   wet etching the first side to form pyramidal surface textures,
      wherein the pyramidal surface textures comprise (111) crystal orientation;
   depositing a buffer layer on the pyramidal surface textures;
   depositing a layer of GaN on the buffer layer;
      wherein the GaN surface comprises (0001) crystal orientation;
      wherein the buffer layer comprises lattice matching between the (111) crystal orientation of silicon and the (0001) crystal orientation of GaN.

2. A method as in claim 1 wherein wet etching comprises etching in a solution of potassium hydroxide or tetramethyl ammonium hydroxide.

3. A method as in claim 1
   wherein the effective CTE of the sintered composite substrate is higher than that of GaN so that the deposited GaN layer does not crack when cooled to room temperature.

4. A method as in claim 1 wherein the ceramic material comprises a magnesium oxide-aluminum oxide-silicon oxide composition.

5. A method as in claim 1 wherein sintering comprises annealing at temperature 850 to 950 C.

6. A method as in claim 1 wherein the thickness of the silicon substrate is less than 50 microns.

7. A method as in claim 1 further comprising
   applying an adhesive to the first side of the silicon substrate before disposing the ceramic material.

8. A method as in claim 1 wherein the ceramic material further comprises an adhesive additive.

* * * * *